US012002645B2

(12) United States Patent
Liang et al.

(10) Patent No.: US 12,002,645 B2
(45) Date of Patent: *Jun. 4, 2024

(54) ELECTRONIC DEVICE, PCB AND ELECTRIC TOOL

(71) Applicant: SHENZHEN TOPBAND CO., LTD., Guangdong (CN)

(72) Inventors: Shilin Liang, Guangdong (CN); Jian Chen, Guangdong (CN); Hongyuan Chen, Guangdong (CN); Shi Luo, Guangdong (CN); Junbiao Li, Guangdong (CN); Hai Huang, Guangdong (CN); Shuquan Zheng, Guangdong (CN)

(73) Assignee: SHENZHEN TOPBAND CO., LTD., Shenzhen (CN)

( * ) Notice: Subject to any disclaimer, the term of this patent is extended or adjusted under 35 U.S.C. 154(b) by 446 days.

This patent is subject to a terminal disclaimer.

(21) Appl. No.: 17/421,592

(22) PCT Filed: Jan. 8, 2019

(86) PCT No.: PCT/CN2019/070798
§ 371 (c)(1),
(2) Date: Jul. 8, 2021

(87) PCT Pub. No.: WO2020/142894
PCT Pub. Date: Jul. 16, 2020

(65) Prior Publication Data
US 2022/0161409 A1  May 26, 2022

(51) Int. Cl.
*H01H 9/06* (2006.01)
*H01H 3/00* (2006.01)
(Continued)

(52) U.S. Cl.
CPC .............. *H01H 9/063* (2013.01); *H01H 3/00* (2013.01); *H01H 9/061* (2013.01); *H01H 13/00* (2013.01);
(Continued)

(58) Field of Classification Search
CPC ...... H01H 9/063; H01H 9/061; H01H 15/005; H05K 1/181
See application file for complete search history.

(56) References Cited

U.S. PATENT DOCUMENTS

| 4,660,019 | A | * | 4/1987 | Bauer | ..................... | H01H 9/061 |
| | | | | | | 200/522 |
| 4,737,661 | A | * | 4/1988 | Lessig, III | ............. | H01H 9/061 |
| | | | | | | 307/140 |
| 4,763,101 | A | * | 8/1988 | Bauer | ..................... | H01H 9/061 |
| | | | | | | 338/172 |
| 4,903,003 | A | * | 2/1990 | Kuratani | ................ | H01C 10/50 |
| | | | | | | 338/200 |

(Continued)

FOREIGN PATENT DOCUMENTS

| CN | 108155037 A | 6/2018 |
| CN | 207489704 U | 6/2018 |

OTHER PUBLICATIONS

International Search Report of PCT Patent Application No. PCT/CN2019/070798 dated Sep. 27, 2019.

*Primary Examiner* — Kyung S Lee

(57) ABSTRACT

The invention provides an electronic device, a PCB and an electric tool; the electronic device comprises a main body, a first electric connecting part, a variable resistor, a speed regulating contact, a reversing electric connecting part, a reversing contact, a speed regulating handle and a reversing handle, the first electric connecting part is connected with the main body in a melt adhesive curing mode, and one end of the first electric connecting part is exposed out of the main body; the speed regulating handle and the main body form a first space, the speed regulating contact and the variable resistor are arranged in the first space, and under the drive of the speed regulating handle, the speed regulating contact (Continued)

and the variable resistor relatively slide; under the driving of the reversing handle, the reversing contact and the reversing electric connecting part relatively slide for reversing.

20 Claims, 4 Drawing Sheets

(51) Int. Cl.
*H01H 13/00* (2006.01)
*H01H 15/00* (2006.01)
*H05K 1/18* (2006.01)

(52) U.S. Cl.
CPC .......... *H01H 15/00* (2013.01); *H01H 15/005* (2013.01); *H05K 1/181* (2013.01)

(56) References Cited

U.S. PATENT DOCUMENTS

| | | | | |
|---|---|---|---|---|
| 4,968,922 | A * | 11/1990 | Bittel | H01H 9/063 |
| | | | | 200/290 |
| 6,555,773 | B1 * | 4/2003 | Broghammer | H01H 3/20 |
| | | | | 200/50.01 |
| 6,717,080 | B1 * | 4/2004 | Chan | H01H 13/08 |
| | | | | 200/334 |
| 7,297,891 | B2 * | 11/2007 | Omori | H01H 9/063 |
| | | | | 200/522 |
| 8,410,387 | B2 * | 4/2013 | Niklewski | H01H 9/061 |
| | | | | 200/522 |
| 9,899,899 | B2 * | 2/2018 | Sergyeyenko | H02P 25/24 |
| 11,424,088 | B2 * | 8/2022 | Liang | H01H 9/061 |
| 11,477,889 | B2 * | 10/2022 | Lewis | H02K 7/145 |

* cited by examiner

ELECTRONIC DEVICE, PCB AND ELECTRIC TOOL

BACKGROUND OF THE INVENTION

1. Technical Field

The invention belongs to the technical field of electric tools, and particularly relates to an electronic device, a PCB and an electric tool.

2. Description of Related Art

Electric tool is a kind of tool which is held by the operator's hand to operate and driven by a small power motor or electromagnet through a transmission mechanism to operate the working head, the electric tool has a wide variety of type, and has the advantages of convenient carrying, simple operation, multiple functions, reduce labor intensity, improving work efficiency and the like, it is widely used in construction, housing decoration, automobile assembly, construction machinery and other fields, and also entered the family in large numbers.

At present, that electric tool usually has a speed regulation function and a commutating function to meet the requirement of different working conditions, the speed regulation function of the electric tool is usually realized by a speed regulation switch which is independently arrange, the speed regulation switch usually adopts an electronic circuit or a microprocessor chip to change the number of stages, voltage, current or frequency of a motor to control the rotating speed of the motor, The commutating function is usually achieved by a separate set of commutator and other components, so that the motor can achieve higher performance. Since the speed regulation switch and the commutator are usually produced by special manufacturers, the parts purchasing cost is usually high, which leads to the high cost of the electric tool.

BRIEF SUMMARY OF THE INVENTION

The embodiment of the invention provides an electronic device, aiming at solving the problem of high cost caused by the fact that an existing electric tool simultaneously adopts a speed regulation switch and a commutator.

The embodiment of the invention is realized as follows, the embodiment of the invention provides an electronic device which comprises a main body, a first electric connecting part, a variable resistor, a speed regulating contact, a reversing electric connecting part, a reversing contact, a speed regulating handle and a reversing handle, wherein the resistance value of the variable resistor changes along the length direction;

the first electric connecting part is connected with the main body in a melt adhesive curing mode, and one end of the first electric connecting part is exposed out of the main body;

one of the speed regulating contact and the variable resistor is arranged on the main body and connected with the first electric connecting part, and the other is arranged on the speed regulating handle;

the speed regulating handle is slidably connected with one end of the main body and forms a first space with the main body; the speed regulating contact and the variable resistor are arranged in the first space, and the speed regulating contact is contact with the variable resistor, under the drive of the reversing handle, the speed regulating contact and the variable resistor relatively slide in the length direction of the variable resistor for speed regulation;

the reversing electric connecting part is connected with the main body in a melt adhesive curing mode, one end of the reversing electric connecting part is exposed out of the main body, and the reversing contact is arranged on the reversing handle;

the reversing handle is slidably connected with the other end of the main body, the reversing contact is contacted with the reversing electric connecting part, and under the drive of the reversing handle, the reversing contact and the reversing electric connecting part relatively slide for reversing.

Furthermore, the melt adhesive curing mode is an injection mol mode.

Furthermore, one end of the speed regulating handle is a tubular structure, and the end is provided with an opening, that open end of the speed regulating handle is sleeved outside one end of the main body through an elastic piece;

the speed regulating contact comprises a first connecting end and a first elastic sheet connected with the first connecting end, the first connecting end is connected with the inner wall of the speed regulating handle, and the first elastic sheet is contacted with the variable resistor;

a first annular groove is circumferentially arranged at one end of the main body, and a first sealing ring is sleeved in the first annular groove;

the inner wall of the speed regulating handle is connected with the outer wall of one end of the main body through the first sealing ring, and the first space is formed in the speed regulating handle.

Furthermore, the reversing handle and the main body form a second space, and both the reversing contact and the reversing electric connecting part are positioned in the second space.

Furthermore, the reversing electric connecting part includes a second electric connecting part and a third electric connecting part;

the reversing contact comprises a first contact and a second contact which are connected with each other;

and when the reversing handle drives the reversing contact to slide, the first contact and the second contact can be respectively contacted with or separated from the second electric connecting part and the third electric connecting part.

Furthermore, the reversing electric connecting part includes a fourth electric connecting part, a fifth electric connecting part, and a sixth electric connecting part;

the reversing contact comprises a third contact and a fourth contact which are connected with each other;

and when the reversing handle drives the reversing contact to slide, the third contact and the fourth contact can be respectively contacted with the fourth electric connecting part and the fifth electric connecting part, or respectively contacted with the fifth electric connecting part and the sixth electric connecting part.

Furthermore, the other end of the main body is provided with a housing with an inlet;

one end of the reversing handle, which is connected with the reversing contact, is provided with a second annular groove in the circumferential direction, and a second sealing ring is sleeved in the second annular groove;

the inner wall of the housing is connected with the outer wall of the other end of the main body through the second sealing ring, and the second space is formed in the housing.

Furthermore, the variable resistor is arranged on the main body through a first printed board and connected with the first electric connecting part.

The embodiment of the invention also provides a PCB which comprises a PCB body and the electronic device fixedly arranged on the PCB body.

The embodiment of the invention also provides an electric tool, which comprises the electronic device.

In the embodiment of the invention, the first electric connecting part and the reversing electric connecting part are connected with the main body in a melt adhesive curing mode, and the first electric connecting part, the reversing electric connecting part and the main body are installed, the installation process of the first electric connecting part, the reversing electric connecting part and the main body makes the first electric connecting part, the reversing electric connecting part and the main body into a whole, prevents the first electric connecting part, the reversing electric connecting part and the main body from falling off, improves the stability of the electronic device, reduces the production process and saves the production cost. And that speed regulating handle and the main body form a first space, and the speed regulating contact and the variable resistor are arranged in the first space, so that the speed regulating contact or the variable resistor is effectively prevented from being pollute by external impurities such as dust or water and the like, the phenomena of short circuit, poor contact and the like are prevented, and normal operation of the electronic device is ensured.

DETAILED DESCRIPTION OF THE INVENTION

In order to make the objects, technical schemes and advantages of the present invention more clearly understood, the present invention will be further described in detail with reference to the accompanying drawings and embodiments. It should be understood that the specific embodiments described herein are merely illustrative of the present invention and are not intended to be limiting of the present invention.

In the embodiment of the invention, a first electric connecting part, a reversing electric connecting part and a main body are connected in a melt adhesive curing mode, and a speed regulating handle and the main body form a first space; and in the melt adhesive cure mode, the installation process of the first electric connecting part, the reversing electric connecting part and the main body is simplified, so that the first electric connecting part, the reversing electric connecting part and the main body become a whole, prevent the first electric connecting part, the reversing electric connecting part and the main body fall off, improve the stability of the electronic device, reduce the production process and save the production cost. The speed regulating contact and the variable resistor are arranged in the first space, so that the speed regulating contact or the variable resistor is effectively prevented from being polluted by external impurities such as dust or water and the like, the phenomena of short circuit, poor contact and the like are prevented, and normal work of the electronic device is ensured.

Embodiment 1

Figure 1:
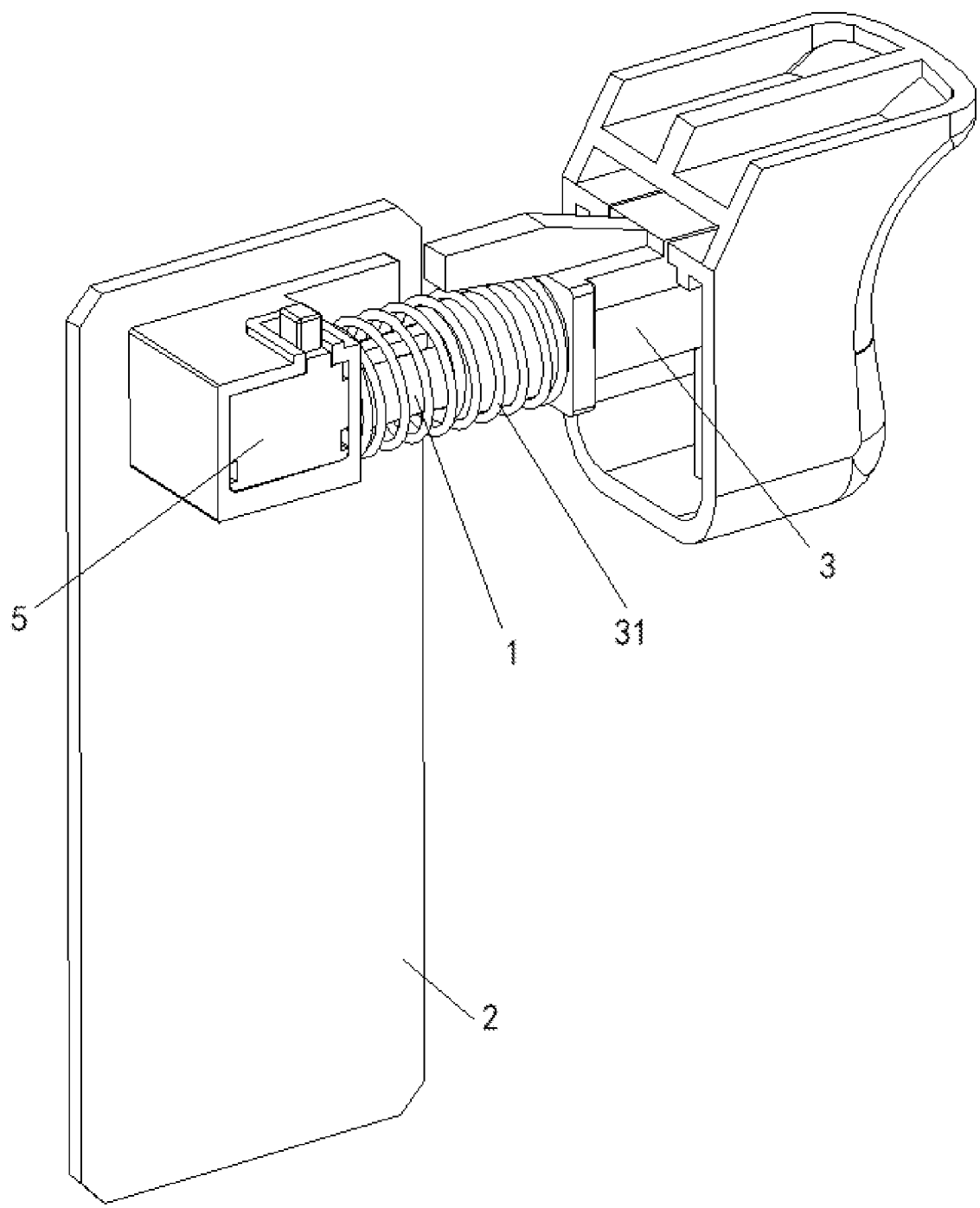
FIG. 1 is a schematic structural diagram of an electronic device according to an embodiment of the present invention.
Figure 2:
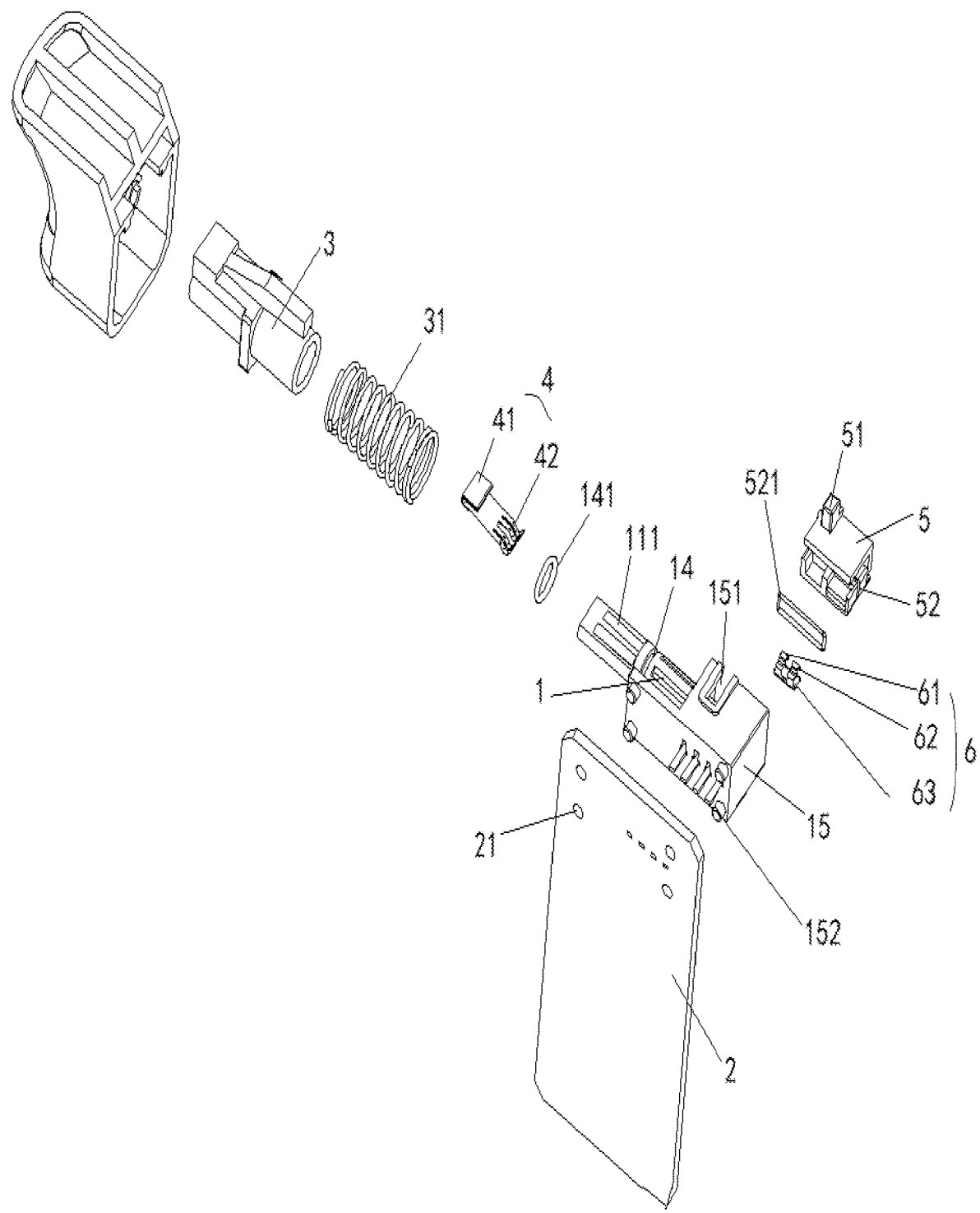
FIG. 2 is an exploded view of the electronic device shown in FIG. 1 at a first viewing angle.

As shown in FIG. 1 and FIG. 2, the embodiment of the invention provides an electronic device, which comprises a main body 1, a first electric connecting part 11, a variable resistor 111, a speed regulating contact 4, a reversing electric connecting part, a reversing contact 6, a speed regulating handle 3 and a reversing handle 5, wherein the resistance value of the variable resistor 111 changes along the length direction;

the first electric connecting part 11 is connected with the main body 1 in a melt adhesive curing manner, and one end of the first electric connecting part 11 is exposed out of the main body 1;

one of the speed regulating contact 4 and the variable resistor 111 is arranged on the main body 1 and is connected with the first electric connecting part 11, and the other is arranged on the speed regulating handle 3;

the speed regulating handle 3 is slidably connected with one end of the main body 1, and forms a first space with the main body 1, the speed regulating contact 4 and the variable resistor 111 are arranged in the first space, and the speed regulating contact 4 is in contact with the variable resistor 111, under the drive of the speed regulating handle 3, the speed regulating contact 4 and the variable resistor 111 relatively slide in the length direction of the variable resistor 111 for speed regulation;

the reversing electric connecting part is connected with the main body 1 in a melting glue solidifying mode, one end of the reversing electric connecting part is exposed out of the main body 1, and the reversing contact 6 is arranged on the reversing handle 5;

the reversing handle 5 is slidably connected with the other end of the main body 1, the reversing contact 6 is contacted with the reversing electric connecting part, and under the driving of the reversing handle 5, the reversing contact 6 and the reversing electric connecting part are relatively slide for reversing.

The reversing contact 6 and the reversing electric connection part are contacted with each other, and the speed regulating contact 4 and the variable resistor 111 are contacted with each other. The speed regulating and the reversing can be realized only by satisfying the function, so that the reversing contact 6 or the reversing electric connecting part is fixedly arranged on the main body 1, and the speed regulating contact 4 or the variable resistor 111 is fixedly arranged on the main body 1.

The electronic device can be applied to an electric tool to adjust the rotating speed and the rotating direction of the working head, so that the electric tool can adapt to various working conditions. The first electric connecting part 11 and the reversing electric connecting part can be connected with a controller, the controller can be a controller electrically connected with a motor in an electric tool, the first electric connecting part 11 can be a conductive metal sheet, and the main body 1, the speed regulating handle 3 and the reversing handle 5 can be made of non-conductive materials such as plastic. And the first electric connecting part 11 is connected with the main body by adopt a melt adhesive solidification mode, and the melt adhesive solidification mode can be a hot melt mode or an injection molding mode. In addition, the variable resistor 111 may be made of a long carbon film.

In the embodiment of the invention, the first electric connecting part, the reversing electric connecting part and the main body are connected in a melt adhesive curing mode, so that the mounting process of the first electric connecting part, the reversing electric connecting part and the main body is simplified, the production process is reduced and the production cost is saved. And the speed regulating handle and the main body form a first space, and the speed regulating contact and the variable resistor are arranged in the first space, so that the speed regulating contact or the variable resistor is effectively prevented from being pollute by dust or water and other sundries from the outside, short circuit or poor contact is prevented, and normal operation of the electronic device is ensured.

Embodiment 2

On the basis of the first embodiment, the present invention further provides an optional embodiment, in which the melt adhesive curing mode, can be specifically an injection molding mode.

Embodiment 3

On the basis of the first embodiment, the present invention further provides an optional embodiment. As shown in FIG. 2, one end of the speed regulating handle 3 is of a cylindrical structure, and an opening is provided at the end part, and the open end of the speed regulating handle 3 can be sleeved outside one end of the main body 1 through an elastic piece 31; the speed regulating contact 4 can comprise a first connecting end 41 and a first elastic sheet 42 connected with the first connecting end 41, wherein the first connecting end 41 is connected with the inner wall of the speed regulating handle 3; the first elastic sheet 42 contacts with the variable resistor 111; one end of the main body 1 may be circumferentially provided with a first annular groove 14, and a first sealing ring 141 is sleeved in the first annular groove 14; an inner wall of the speed regulating handle 3 is connected to an outer wall of one end of the main body 1 through the first seal ring 141, and the aforementioned first space is formed in the speed regulating handle 3.

Wherein, the elastic piece 31 can be a spring, the speed regulating handle 3 can realize elastic connection with one end of the main body 1 through a spring, that is, the speed regulating handle 3 can drive the speed regulating contact 4 to move relative to the main body 1 when the speed regulating handle 3 is pushed, so that the first elastic sheet 42 of the speed regulating contact 4 slides on the variable resistor 111 to change an output resistance signal, so that the controller can adjust the rotating speed of the motor of the electric tool according to the constantly changing resistance signal, has simple structure, low cost and reliable use. In addition, the first electric connecting part 11 may includes two parts that arranged side by side, and the speed regulating contact 4 may include two first elastic sheets connected and arranged side by side, and the two first elastic sheets are in one-to-one corresponding contact with the two first electric connecting portions 11.

According to the above embodiment, through the arrangement of the first sealing ring 141, a first space can be enclosed by the sealing ring, the outside of the main body 1 and the inner wall of the speed regulating handle 3, and the variable resistor 111 and the speed regulating contact 4 can be located in the first space. Therefore, the influence of foreign matters such as external dust or water on the sliding contact between the variable resistor 111 and the speed regulating contact 4 is better avoided, the adverse phenomena such as short circuit and the like are prevented, the normal output of a resistance signal is ensured, and further the normal operation of the electronic device is ensured.

Embodiment 4

On the basis of the first embodiment, the present invention further provides an alternative embodiment. Referring to FIGS. 1 and 2, the reversing handle 5 and the main body 1 form a second space, and both the reversing contact 6 and the reversing electric connecting part are located in the second space.

According to the embodiment of the invention, one of the reversing contact and the reversing electric connecting part is connected with the main body in a melt adhesive curing mode, so that the installation process of the reversing contact or the reversing electric connecting part and the main body is simplified, the reversing contact or the reversing electric connecting part and the main body are integrated into a whole, prevents the first electric connecting part, the reversing electric connecting part and the main body from falling off, improves the stability of the electronic device, reduces the production process and saves the production cost. And a second space is form by that reversing handle and the main body, the reversing contact and the reversing electric connecting part are arranged in the second space, so that the phenomenon that the reversing contact and the reversing electric connecting part are polluted by external sundries such as dust or water and the like are effectively prevented from entering, short circuit or poor contact is prevented, and normal operation of the electronic device is ensured.

Embodiment 5

Figure 3:
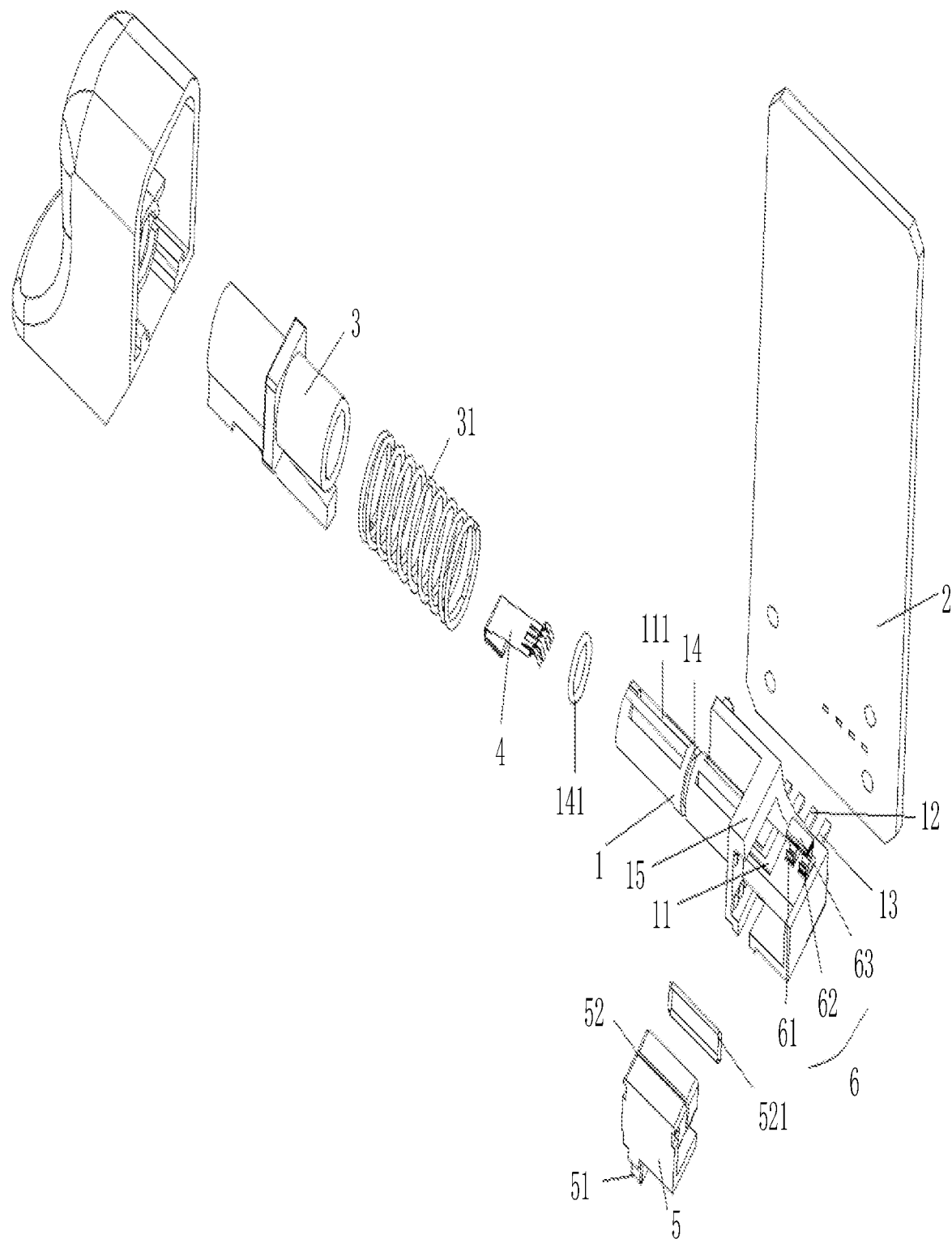
FIG. 3 is an exploded view of the electronic device shown in FIG. 1 at a second viewing angle.

On the basis of Embodiment 4, the present invention further provides an optional embodiment. Referring to FIG. 3, the aforementioned reversing electric connecting part may specifically include a second electric connecting part 12 and a third electric connecting part 13, and both the second electric connecting part 12 and the third electric connecting part 13 may be conductive metal sheets; the reversing contact 6 may comprise a first contact 61 and a second contact 62 connected; when the reversing handle 5 drives the reversing contact 6 to slide, the first contact 61 and the second contact 62 can be brought into contact with or separated from the second electric connecting part 12 and the third electric connecting part 13, respectively. The second electric connecting part 12 and the third electric connecting part 13 can be connected in a commutation circuit, and when the first contact 61 and the second contact 62 of the reversing contact 6 can be respectively contacted with the second electric connecting part 12 and the third electric connecting part 13, the commutation circuit can be turn on, when the first contact 61 and the second contact 62 can be separated from the second electric connecting part 12 and the third electric connecting part 13 respectively, the commutation circuit can be turn off, so that the controller can control the commutation of the motor of the electric tool and has simple structure and convenient realization.

Embodiment 6

On the basis of the first embodiment, the present invention further provides an optional embodiment, in which the aforementioned reversing electric connecting part is not limited to the above structure, and in this embodiment, the reversing electric connecting part may specifically include a fourth electric connecting part, a fifth electric connecting part and a sixth electric connecting part; the reversing contact may comprise a third contact and a fourth contact connected; when the reversing handle drives the reversing contact to slide, the third contact and the fourth contact can be in contact with the fourth electric connecting part and the fifth electric connecting part, respectively, or in contact with the fifth electric connecting part and the sixth electric connecting part, respectively. Wherein, the fourth electric connecting part and the fifth electric connecting part can be connected in a first commutation circuit, the fifth electric connecting part and the sixth electric connecting part can be connected in a second commutation circuit, when the third contact and the fourth contact of the reversing contact respectively contact with the fourth electric connecting part and the fifth electric connecting part, the first commutation circuit can be turn on, when the third contact and the fourth contact of the reversing contact are respectively contacted with the fifth electric connecting part and the sixth electric connecting part, the second commutation circuit can be turn on, so that the controller can control the motor of the electric tool to reverse, the structure is simple, and the realization is convenient.

Embodiment 7

Figure 4:
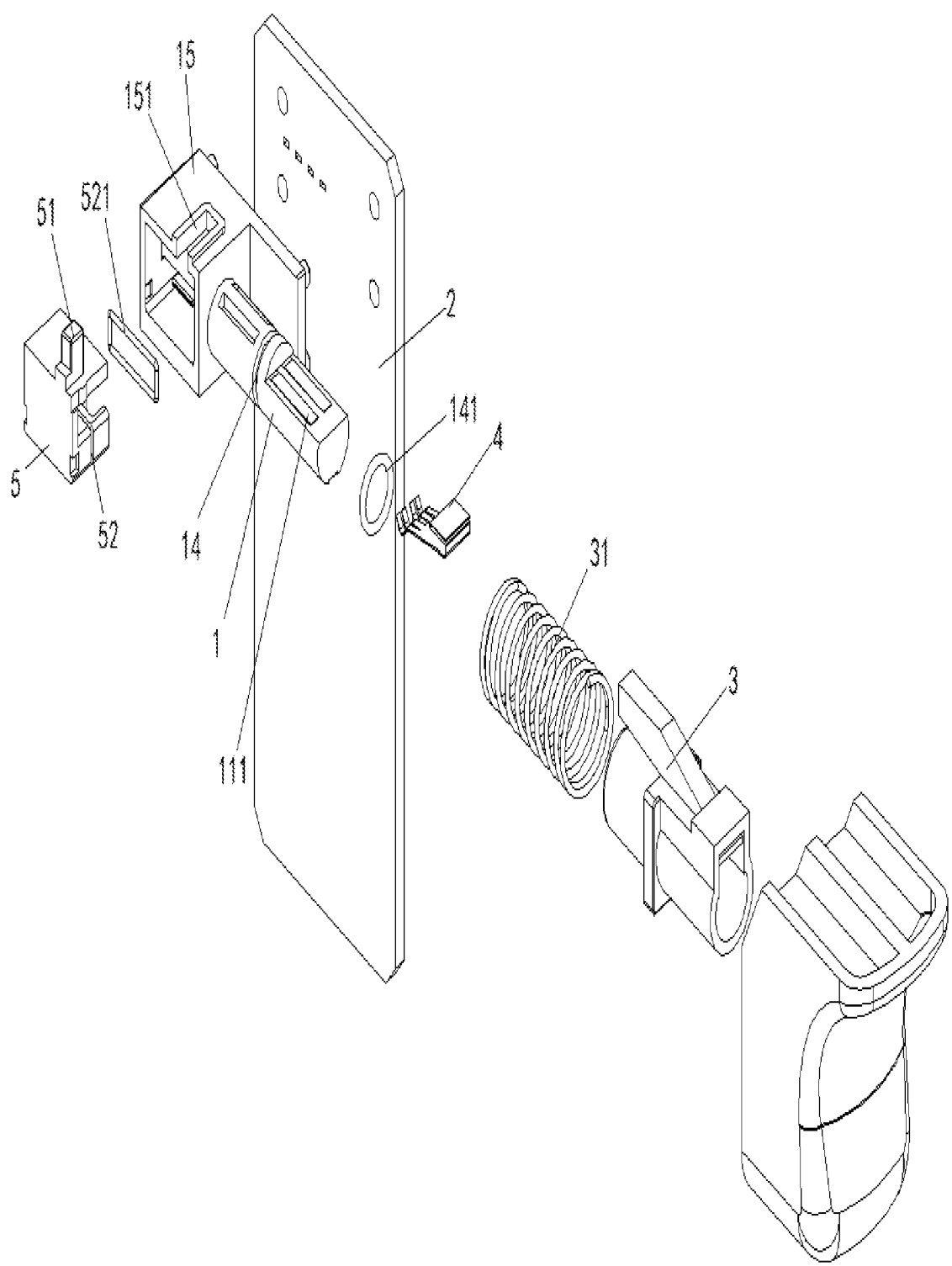
FIG. 4 is an exploded view of the electronic device shown in FIG. 1 at a third viewing angle.

On the basis of the fifth embodiment, the present invention further provides an alternative embodiment. Referring to FIG. 3 or FIG. 4, the other end of the main body 1 is provided with a housing 15 having an inlet; a second annular groove 52 may be circumferentially arranged at one end of the reversing handle 5 connected with the reversing contact 6, and a second sealing ring 521 may be sleeved in the second annular groove 52; the inner wall of the housing 15 is connected with the outer wall of the other end of the main body 1 through a second sealing ring 521, and the aforementioned second space is formed in the housing 15. By the arrangement of the second sealing ring 521, a second space can be enclosed between the sealing ring, the outside of the reversing handle 5 and the inner wall of the housing 15, and the second electric connecting part 12, the third electric connecting part 13 and the reversing contact 6 are all positioned in the second space, so that the dust, water and other sundries outside can be prevented from acting on the reversing contact 6, The sliding contact between the second electric connecting part 12 and the third electric connecting part 13 is affected to prevent the occurrence of undesirable phenomena such as a short circuit, guaranteeing the normal output of the signal and further ensuring the normal work of the electronic device.

Embodiment 8

On the basis of the seventh embodiment, the present invention further provides an optional embodiment. Referring to FIG. 3 and FIG. 4, in combination with FIG. 1, the second electric connecting part 12 and the third electric connecting part 13 are located in the housing 15, and a sliding groove 151 communicated with the inlet is formed in one side surface of the housing 15; the reversing handle 5 is U-shaped, and a sliding handle 51 is disposed on one side of the reversing handle 5. The reversing handle 5 is slidably connected to the housing 15 and is sleeved on the other end of the main body 1, and the sliding handle 51 is disposed in the sliding groove 151.

According to the above embodiment, the reversing handle 5 is slidably connected in the housing 15, and when the sliding handle 51 is pushed, the sliding handle 51 can move in the sliding groove 151 of the housing 15 and drive the reversing handle 5 to slide in the housing 15, so as to drive the second elastic sheet and the third elastic sheet of the reversing contact 6 to contact with the second electric connecting part 12 and the third electric connecting part 13 respectively, or away from the second electric connecting part 12 and the third electric connecting part 13, so that a circuit in which the second electric connecting part 12 and the third electric connecting part 13 are positioned can be turned on or turned off, and a controller can control the commutation of a motor of the electric tool, thereby realizing the commutation function of the electronic device.

There are various sliding connection modes of the reversing handle 5 in the housing 15. For example, a slideway matched with the profile shape of the reversing handle 5 can be arranged in the housing 15, so that the reversing handle 5 can move in the slideway under the driving of the sliding handle 51. In addition, in order to prevent the reversing handle 5 from falling out of the housing 15, a clamping projection can be arranged on the inner wall of the housing 15, and a matching clamping groove can be arranged on the corresponding position of the reversing handle 5, so that the clamping projection can be clamped and connected with the clamping groove.

Specifically, referring to FIG. 3 and FIG. 4 in combination with FIG. 1, the reversing contact 6 comprises a second connecting end 63 and a second elastic sheet and a third elastic sheet connected with the second connecting end 63, the second elastic sheet and the third elastic sheet form a first contact 61 and a second contact 62 respectively, and the second connecting end 63 is connected with the inner wall of the reversing handle 5. The second elastic sheet and the third elastic sheet are used for respectively contacting with the second electric connecting part 12 and the third electric connecting part 13.

Embodiment 9

On the basis of Embodiments 1 to 8, the present invention further provides an alternative embodiment in which the aforementioned variable resistor can be disposed on the main body 1 through a first printed board (not shown) and connected to the first electric connecting part 11. Specifically, the variable resistor at this time can be a strip-shaped carbon film pasted on the first printed board, and can also be a plurality of resistors which are arranged on one side of the first printed board and are distributed along a straight line at intervals, and the resistance values of the resistors gradually change along the arrangement direction of the resistors; and copper sheets which are connected with each resistor in a one-to-one correspondence manner are arranged on the other side of the first printed board, the speed regulating contact on the speed regulating handle is connected with a copper sheet and further connected with any one of the resistors to achieve the purpose of speed regulation, thereby improving the processing convenience of the electronic device.

Embodiment 10

Referring to FIG. 2, an embodiment of the invention further provides an electric tool, which comprises a PCB body 2 and the electronic device fixedly arranged on the PCB body 2. The electronic device may be provided with one or more positioning posts 152 on the outer wall of the housing 15; the PCB body 2 may be provided with one or more positioning holes 21 adapted to the positioning posts 152; the positioning posts 152 is inserted into the positioning holes 21. The PCB body 2 and the electronic device can be electrically and stably connected to each other by the arrangement of the positioning posts 152 and the positioning holes 21. Here, in order to further secure the fixing effect, the number of the positioning posts 152 and the positioning holes 21 may be plural, for example, four, and may be arranged in a rectangular array so as to surround the connection points between the first third electric connecting part 11 to the third electric connecting part 13 and the PCB body 2.

The PCB body 2 and the electronic device can also be connected by soldering, and the pins of the electronic device are soldered in the soldering holes of the PCB body 2.

Embodiment 11

The embodiment of the invention also provides an electric tool, which comprises the electronic device.

Accord to that electronic device disclosed by the embodiment of the invention, the first electric connecting part, the reversing electric connecting part and the main body are connected in a melt adhesive curing mode, so that the installation process of the first electric connecting part, the reversing electric connecting part and the main body is simplified, the production process is reduced and the production cost is saved. And that speed regulating handle and the main body form a first space, and the speed regulating contact and the variable resistor are arranged in the first space, so that the speed regulating contact or the variable resistor is effectively prevented from being pollute by dust or water and other sundries from the outside, short circuit or poor contact is prevented, and normal operation of the electronic device is ensured.

The above description is merely illustrative of the preferred embodiments of the present invention, and is not intended to limit the present invention. Any and all modifications, equivalents, substitutions and improvements within the spirit and principle of the invention are intended to be encompassed by the invention

What is claimed is:

1. An electronic device, wherein comprising: a main body, a first electric connecting part, a variable resistor, a speed regulating contact, a reversing electric connecting part, a reversing contact, a speed regulating handle and a reversing handle, wherein the resistance value of the variable resistor varies along the length direction;
the first electric connecting part is connected with the main body in a melt adhesive curing mode, and one end of the first electric connecting part is exposed out of the main body;
one of the speed regulating contact and the variable resistor is arranged on the main body and connected with the first electric connecting part, and the other is arranged on the speed regulating handle;
the speed regulating handle is connected with one end of the main body in a sliding way and forms a first space with the main body; the speed regulating contact and the variable resistor are arranged in the first space and are in contact with the variable resistor, and the speed regulating contact is in contact with the variable resistor, under the drive of the reversing handle, the speed regulating contact and the variable resistor relatively slide in the length direction of the variable resistor for speed regulation;
the reversing electric connecting part is connected with the main body in a melt adhesive curing mode, one end of the reversing electric connecting part is exposed out of the main body, and the reversing contact is arranged on the reversing handle;
the reversing handle is slidably connected with the other end of the main body, the reversing contact is contacted with the reversing electric connecting part, and under the drive of the reversing handle, the reversing contact and the reversing electric connecting part relatively slide for reversing.

2. The electronic device according to claim 1, wherein the melt adhesive curing mode is injection mol mode.

3. The electronic device according to claim 1, wherein one end of the speed regulating handle is a tubular structure, and the end is provided with an opening, the open end of that speed regulating handle is sleeve outside one end of the main body through an elastic piece;
the speed regulating contact comprises a first connecting end and a first elastic sheet connected with the first connecting end, the first connecting end is connected with the inner wall of the speed regulating handle, and the first elastic sheet is contacted with the variable resistor;
a first annular groove is circumferentially arranged at one end of the main body, and a first sealing ring is sleeved in the first annular groove;
the inner wall of the speed regulating handle is connected with the outer wall of one end of the main body through the first sealing ring, and the first space is formed in the speed regulating handle.

4. The electronic device according to claim 1, wherein the reversing handle and the main body form a second space, and both the reversing contact and the reversing electric connecting part are positioned in the second space.

5. The electronic device of claim 4, wherein the reversing electric connecting part comprises a second electric connecting part and a third electric connecting part;
the reversing contact comprises a first contact and a second contact which are connected with each other;
and when the reversing handle drives the reversing contact to slide, the first contact and the second contact can be respectively contacted with or separated from the second electric connecting part and the third electric connecting part.

6. The electronic device according to claim 1, wherein the reversing electric connecting part comprises a fourth electric connecting part, a fifth electric connecting part and a sixth electric connecting part;
the reversing contact comprises a third contact and a fourth contact which are connected with each other;
and when the reversing handle drives the reversing contact to slide, the third contact and the fourth contact can be respectively contacted with the fourth electric connecting part and the fifth electric connecting part, or respectively contacted with the fifth electric connecting part and the sixth electric connecting part.

7. The electronic device according to claim 5, wherein the other end of the main body is provided with a housing with an inlet;
one end of the reversing handle, which is connected with the reversing contact, is provided with a second annular groove in the circumferential direction, and a second sealing ring is sleeved in the second annular groove;

the inner wall of the housing is connected with the outer wall of the other end of the main body through the second sealing ring, and the second space is formed in the housing.

8. The electronic device according to claim 1, wherein the variable resistor is arranged on the main body through a first printed board and connected with the first electric connecting part.

9. A PCB, comprising a PCB body and the electronic device according to claim 1, wherein the electronic device is fixedly arranged on the PCB body.

10. A power tool, comprising the electronic device according to claim 1.

11. The electronic device according to claim 2, wherein the variable resistor is arranged on the main body through a first printed board and connected with the first electric connecting part.

12. The electronic device according to claim 3, wherein the variable resistor is arranged on the main body through a first printed board and connected with the first electric connecting part.

13. The electronic device according to claim 4, wherein the variable resistor is arranged on the main body through a first printed board and connected with the first electric connecting part.

14. The electronic device according to claim 5, wherein the variable resistor is arranged on the main body through a first printed board and connected with the first electric connecting part.

15. The electronic device according to claim 6, wherein the variable resistor is arranged on the main body through a first printed board and connected with the first electric connecting part.

16. The electronic device according to claim 7, wherein the variable resistor is arranged on the main body through a first printed board and connected with the first electric connecting part.

17. The power tool according to claim 10, wherein the melt adhesive curing mode is injection mol mode.

18. The power tool according to claim 10, wherein one end of the speed regulating handle is a tubular structure, and the end is provided with an opening, that open end of that speed regulating handle is sleeve outside one end of the main body through an elastic piece;

the speed regulating contact comprises a first connecting end and a first elastic sheet connected with the first connecting end, the first connecting end is connected with the inner wall of the speed regulating handle, and the first elastic sheet is contacted with the variable resistor;

a first annular groove is circumferentially arranged at one end of the main body, and a first sealing ring is sleeved in the first annular groove;

the inner wall of the speed regulating handle is connected with the outer wall of one end of the main body through the first sealing ring, and the first space is formed in the speed regulating handle.

19. The power tool according to claim 10, wherein the reversing handle and the main body form a second space, and both the reversing contact and the reversing electric connecting part are positioned in the second space.

20. The power tool according to claim 19, wherein the reversing electric connecting part comprises a second electric connecting part and a third electric connecting part;

the reversing contact comprises a first contact and a second contact which are connected with each other;

and when the reversing handle drives the reversing contact to slide, the first contact and the second contact can be respectively contacted with or separated from the second electric connecting part and the third electric connecting part.

* * * * *